US012574030B2

(12) United States Patent
Kleimaier et al.

(10) Patent No.: US 12,574,030 B2
(45) Date of Patent: Mar. 10, 2026

(54) DEVICE WITH INVERTER FUNCTIONALITY AND TUNABLE TRIGGER VOLTAGE

(71) Applicant: GlobalFoundries Dresden Module One Limited Liability Company & Co. KG, Dresden (DE)

(72) Inventors: Dominik Martin Kleimaier, Dresden (DE); Stefan Dünkel, Dresden (DE); Halid Mulaosmanovic, Dresden (DE); Zhixing Zhao, Nanjing (CN)

(73) Assignee: GlobalFoundries Dresden Module One Limited Liability Company & Co. KG, Dresden (DE)

( * ) Notice: Subject to any disclaimer, the term of this patent is extended or adjusted under 35 U.S.C. 154(b) by 29 days.

(21) Appl. No.: 18/607,629

(22) Filed: Mar. 18, 2024

(65) Prior Publication Data

US 2025/0293686 A1     Sep. 18, 2025

(51) Int. Cl.
*H03K 17/687*          (2006.01)
(52) U.S. Cl.
CPC ................................ *H03K 17/6872* (2013.01)
(58) Field of Classification Search
CPC .................................................. H03K 17/6872
USPC ........................................................... 327/581
See application file for complete search history.

(56) References Cited

U.S. PATENT DOCUMENTS 6,097,113 A  *  8/2000  Teraoka ............. H03K 19/0013
327/544

2011/0147806 A1     6/2011  Wilson et al.
2023/0395605 A1     12/2023  Dünkel et al.

FOREIGN PATENT DOCUMENTS

CA          3192560 A1      7/2022
DE          19827938 A1     4/1999

OTHER PUBLICATIONS

Sakai et al., "Recent Progress of Ferroelectric-Gate Field-Effect Transistors and Applications to Nonvolatile Logic and FeNAND Flash Memory," Materials, 3, published Nov. 18, 2010, pp. 4950-4964.

(Continued)

*Primary Examiner* — Tomi Skibinski
(74) *Attorney, Agent, or Firm* — David Cain; Hoffman Warnick LLC

(57)                ABSTRACT

A device with inverter functionality and a tunable trigger voltage includes a PFET and an NFET connected in series. The FETs are multi-gated and at least one FET is a threshold voltage (VT) programmable FET. In some embodiments, both FETs are dual-gated (i.e., have two gates) with at least one gate of the two gates being programmable (i.e., configured for VT programmability). In these embodiments, the device includes an input node connected to primary gates of the FETs and additional nodes connected to VT-programmable secondary gates of the FETs, respectively. Alternatively, the device includes an input node connected to secondary gates of the FETs and additional nodes connected to VT-programmable primary gates of the FETs, respectively. Alternatively, the device includes an input node connected to primary gates of the FETs and another input node connected to secondary gates of the FETs, where the primary gates and/or secondary gates are programmable.

20 Claims, 15 Drawing Sheets

100A

(56) References Cited

OTHER PUBLICATIONS

Takahashi et al., "Letter: FeCMOS logic inverter circuits with nonvolatile-memory function," IEICE Electronics Express, Jun. 12, 2009, pp. 831-836.

Dunkel et al., "A FeFET based super-low-power ultra-fast embedded NVM technology for 22nm FDSOI and beyond," In 2017 IEEE International Electron Devices Meeting (IEDM) (pp. 19.7.1-19.7.4).

Mulaosmanovic et al., "Ferroelectric transistors with asymmetric double gate for memory window exceeding 12 V and disturb-free read," Nanoscale, 13(38), Sep. 2021, pp. 16258-16266.

Takahashi et al., "Basic operation of novel ferroelectric CMOS circuits," Electronic Letters, Mar. 27, 2008, vol. 44, No. 7, 1 page, retrieved from: https://www.proquest.com/openview/90ab6100de03bb055c6d2ba0e3f1ea42/1?pq-origsite=gscholar&cbl=1936364 on Jan. 24, 2024.

Gaidhane et al., "Compact Modeling of Drain Current in Double Gate Negative Capacitance MFIS Transistor," In 2018 4th IEEE International Conference on Emerging Electronics (ICEE), 5 pages.

Toprasertpong et al., "Memory Window in Ferroelectric Field-Effect Transistors: Analytical Approach," published in: IEEE Transactions on Electron Devices, vol. 69, Issue 12, Dec. 2022, 7 pages.

Zhao et al., "Ternary Logics Based on 2D Ferroelectric-Incorporated 2D Semiconductor Field Effect Transistors," Frontiers in Materials, vol. 9, Article 872909, May 2022, 8 pages.

European Search Report for corresponding EP Application No. 24199678.4-1201 dated Mar. 10, 2025, 12 pages.

* cited by examiner

100C

200

Fe-G

300

CT-G

400

F-G

100A

100B

100D

100E

DEVICE WITH INVERTER FUNCTIONALITY AND TUNABLE TRIGGER VOLTAGE

BACKGROUND

The present disclosure relates to inverters and similar devices with inverter functionality.

An inverter or a device with inverter functionality is a device configured so that, when an input voltage at an input node switches from a first logic value to a second logic value, an output voltage at an output node switches from the second logic value to the first logic value and vice versa. A conventional inverter includes a P-type field effect transistor (PFET) and an N-type field effect transistor (NFET) connected in series between a positive voltage rail (e.g., at a positive supply voltage (VDD)) and a ground rail (e.g., at 0.0 volts (V)). The device has an input node connected to the gates of the PFET and NFET and an output node at an interconnect between the drain regions of the PFET and NFET. In operation, when the input voltage rises from a low voltage level to at least a trigger voltage (also referred to as a trigger threshold or transition voltage), the output voltage drops to ground. Subsequently, when the input voltage drops from a high voltage level below the threshold trigger voltage, the output voltage rises to VDD. In conventional inverters, the trigger voltage is typically at some fixed level (i.e., not tunable).

SUMMARY

Disclosed herein are embodiments of a device with inverter functionality and a tunable trigger voltage. In the disclosed embodiments, the device can include first transistor (e.g., a P-channel field effect transistor (PFET)) and a second transistor (e.g., an N-channel field effect transistor (NFET) connected in series by an interconnect. The first transistor and/or the second transistor can be threshold voltage (VT) programmable transistors. Additionally, the first transistor and the second transistor can have multiple gates. The device can further include an output node at the interconnect.

In some embodiments, the device can include a first transistor (e.g., a VT-programmable PFET) and second transistor (e.g., a VT-programmable NFET) connected in series with the first transistor by an interconnect. The first transistor can include a first primary gate and a first secondary gate. Similarly, the second transistor can include a second primary gate and a second secondary gate. This device can further include an output node at the interconnect.

In some embodiments, the device can include a first transistor (e.g., a VT-programmable PFET) and second transistor (e.g., a VT-programmable NFET). The first transistor can include a first primary gate and a first secondary gate. Similarly, the second transistor can include a second primary gate and a second secondary gate. The device can further include a first voltage input node, which is connected to the first primary gate and to the second primary gate and further connected to receive a first input voltage, and a second voltage input node, which is connected to the first secondary gate and to the second secondary gate and further connected to receive a second input voltage. The device can further include an interconnect, which connects a first drain region of the first transistor to a second drain region of the second transistor such that the first transistor and the second transistor are connected in series. The device can further include an output node at the interconnect.

It should be noted that all aspects, examples, and features of disclosed embodiments mentioned in the summary above can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The present disclosure will be better understood from the following detailed description with reference to the drawings, which are not necessarily drawn to scale and in which.

DETAILED DESCRIPTION

Figure 1A:
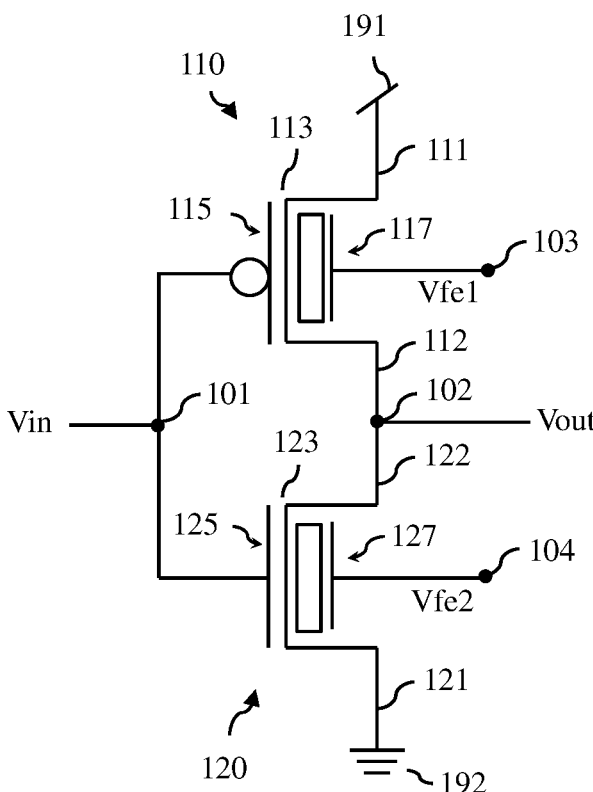
FIGS. 1A-1G are schematic diagrams illustrating devices, respectively, with inverter functionality and a tunable trigger voltage according embodiments disclosed herein.
Figure 1B:
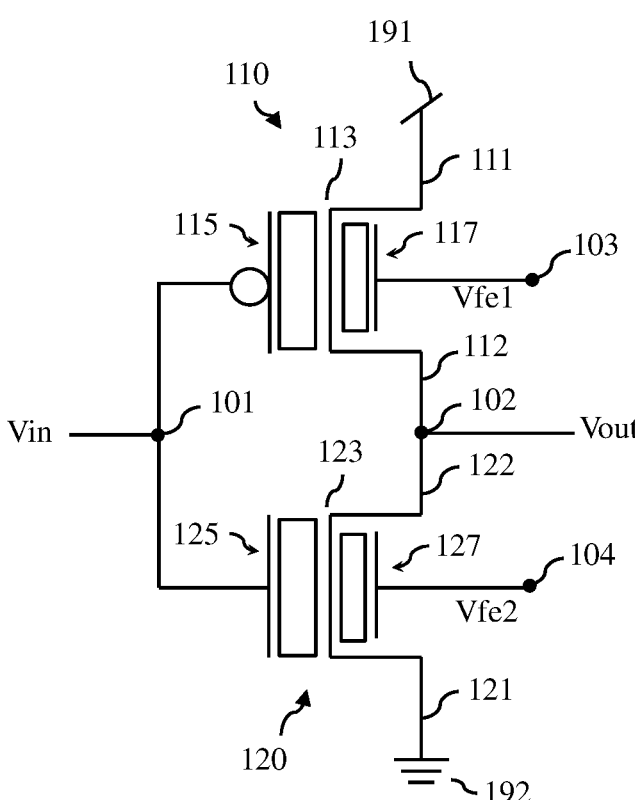
Figure 1C:
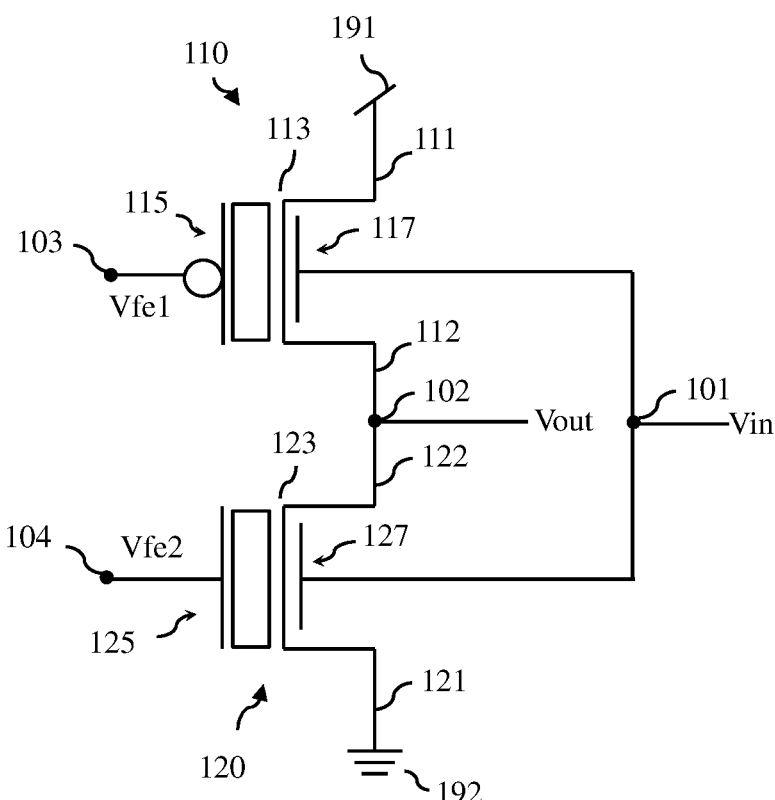
Figure 1D:
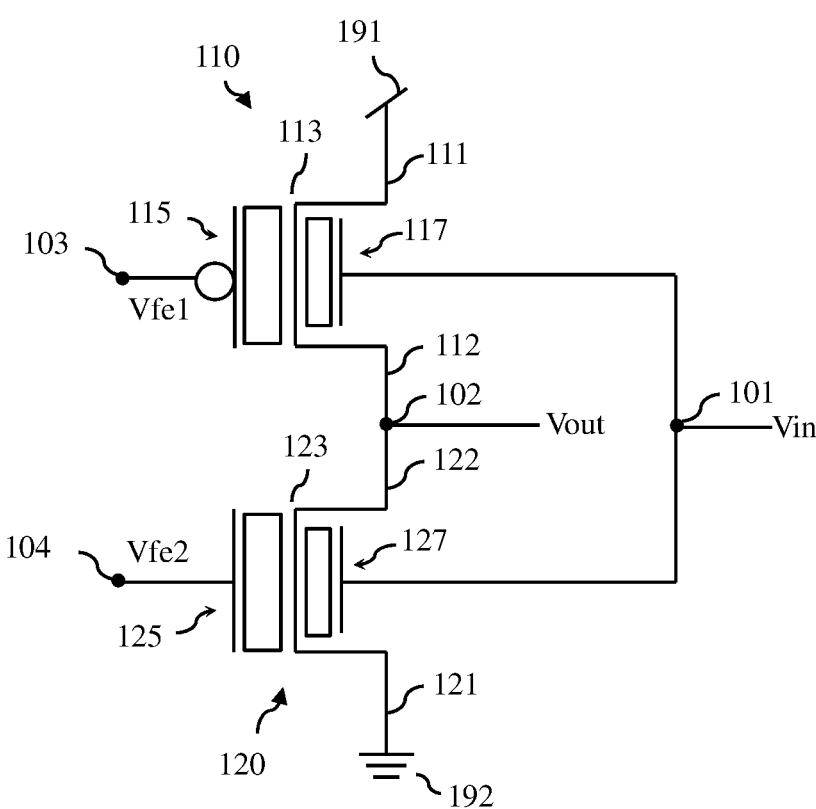
Figure 1E:
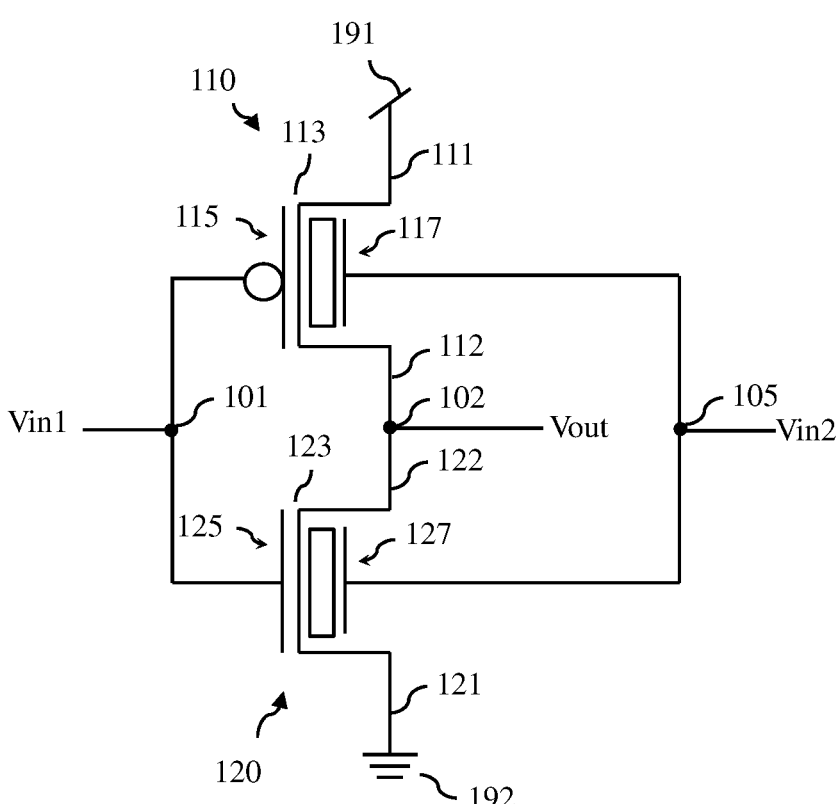
Figure 1F:
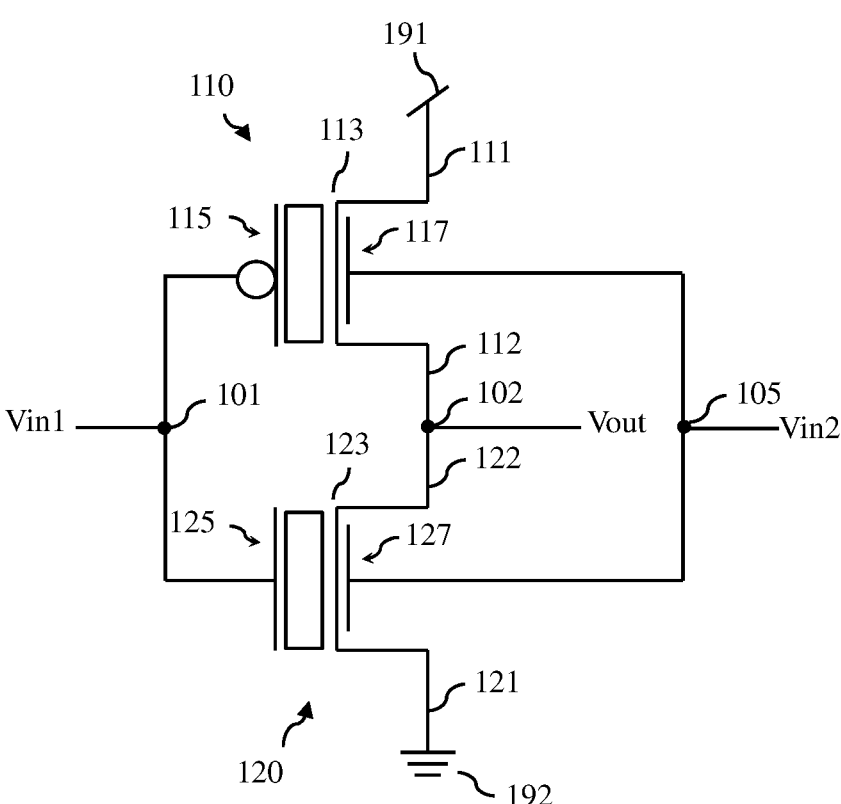
Figure 1G:
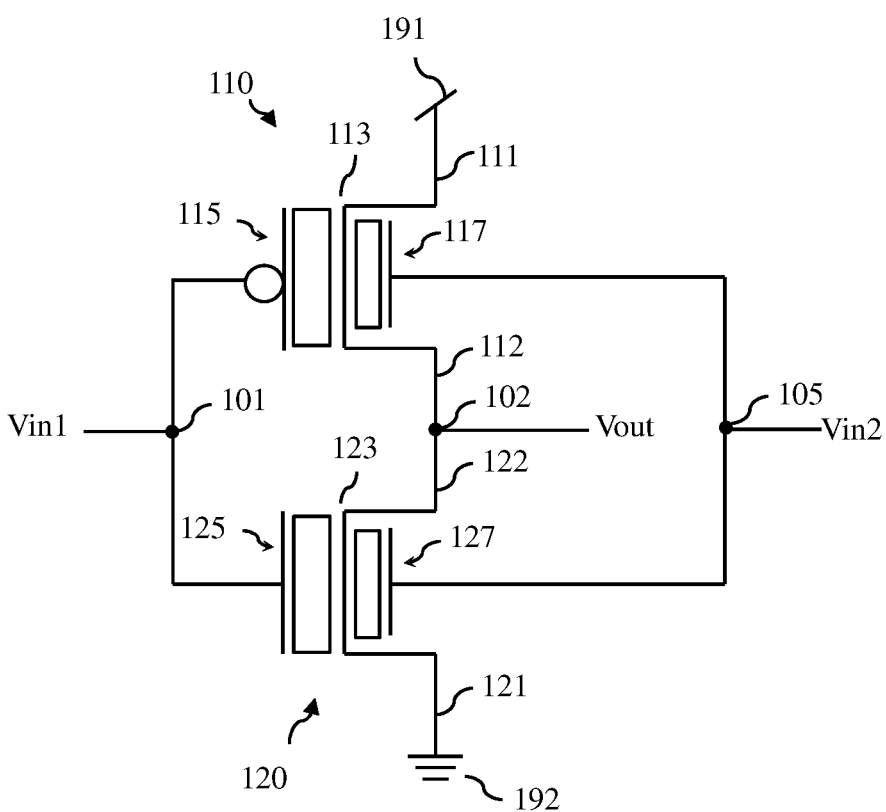

As mentioned above, an inverter or a device with inverter functionality is a device configured so that, when an input voltage at an input node switches from a first logic value to a second logic value, an output voltage at an output node switches from the second logic value to the first logic value and vice versa. A conventional inverter includes a P-type field effect transistor (PFET) and an N-type field effect transistor (NFET) connected in series between a positive voltage rail (e.g., at a positive supply voltage (VDD)) and a ground rail (e.g., at 0.0 volts (V)). The device has an input node connected to the gates of the PFET and NFET and an output node at an interconnect between the drain regions of the PFET and NFET. In operation, when the input voltage rises from a low voltage level to at least a trigger voltage (also referred to as a trigger threshold or transition voltage), the output voltage drops to ground. Subsequently, when the input voltage drops from a high voltage level below the threshold trigger voltage, the output voltage rises to VDD. In conventional inverters, the trigger voltage is typically at some fixed level (i.e., not tunable).

In view of the foregoing, disclosed herein are embodiments of a device with inverter functionality and a tunable trigger voltage. The device can include two field effect transistors (FETs) and, particularly, a P-channel field effect transistor (PFET) and an N-channel field effect transistor (NFET) connected in series between a positive voltage rail and ground. The FETs can be multi-gated and at least one of the FETs can be a VT-programmable FET (e.g., a FeFET, etc.). In some embodiments, both FETs can be dual-gated (i.e., can have two gates) with at least one gate of the two gates being programmable (i.e., being configured for VT programmability). In these embodiments, the device can include: a voltage input node, which receives an input voltage and which is connected to VT-programmable or non-VT-programmable primary gates (e.g., front gates) of the FETs; and additional nodes, which receive independent bias voltages and which are connected to VT-programmable secondary gates (e.g., back gates) of the FETs, respectively. Alternatively, the device can include: a voltage input node, which receives an input voltage and which is connected to VT-programmable or non-VT-programmable secondary gates (e.g., back gates) of the FETs; and additional nodes, which receive independent bias voltages and which are connected to VT-programmable primary gates (e.g., front gates) of the FETs, respectively. Alternatively, the device can include: a first voltage input node, which receives a first input voltage and which is connected to primary gates (e.g., front gates) of the FETs; and a second voltage input node, which receives a second input voltage and which is connected to secondary gates (e.g., back gates) of the FETs, where the primary gates and/or the secondary gates are VT-programmable. In any case, the device can also include a voltage output node at an interconnect between drain regions of the two FETs. In such devices, by selectively adjusting memory windows (MW) of primary and/or secondary gates of the PFET and/or the NFET, the trigger voltage at which an output voltage at the voltage output node switches from a logic "0" to a logic "1" and vice versa can be finely tuned. Specifically, the location, skew, rise/fall time of inverter trigger voltage can be controlled without a static power supply. Such a device with inverter functionality and a tunable trigger voltage can, for example, be incorporated into a logic device (e.g., an inverter or NOT gate), a memory cell, etc.

More specifically, FIGS. 1A-1G are schematic diagrams illustrating devices 100A-100G, respectively, with inverter functionality and a tunable trigger voltage according to disclosed embodiments.

In each of the disclosed embodiments, device 100A-100G includes a first transistor 110 and a second transistor 120. First transistor 110 is a P-channel field effect transistor (PFET). Specifically, this PFET 110 has a first source region 111, a first drain region 112, and a first channel region 113 between first source region 111 and first drain region 112. Those skilled in the art will recognize that, generally, a PFET will include P-type source/drain regions at a relatively high conductivity level (e.g., P+ source/drain regions) and either an N-type channel region at a relatively low conductivity level (e.g., an N– channel region) or an intrinsic (i.e., undoped) channel region. As discussed in greater detail below, PFET 110 can further include multiple gates adjacent to first channel region 113. Second transistor 120 is an N-channel field effect transistor (NFET). Specifically, this NFET 120 has a second source region 121, a second drain region 122, and a second channel region 123 between second source region 121 and second drain region 122. Those skilled in the art will recognize that, generally, an NFET will include N-type source/drain regions at a relatively high conductivity level (e.g., N+ source/drain regions) and either a P-type channel region at a relatively low conductivity level (e.g., a P– channel region) or an intrinsic (i.e., undoped) channel region. As discussed in greater detail below, NFET 120 can further include multiple gates adjacent to second channel region 123.

In each of the disclosed embodiments, PFET 110 and NFET 120 are electrically connected in series between a first voltage rail 191 (also referred to herein as a positive voltage rail), which is at a positive supply voltage (VDD) level, and a second voltage rail 192 (also referred to herein as a ground rail), which is at ground (e.g., at 0.0V). That is, first source region 111 of PFET 110 is electrically connected to first voltage rail 191, second source region 121 of NFET 120 is electrically connected to second voltage rail 192. Additionally, first drain region 112 of PFET 110 is electrically connected (e.g., by an interconnect) to second drain region 122 of NFET 120. This interconnect can be, for example, a local interconnect (e.g., a silicide layer) extending across top surfaces of immediately adjacent first and second drain regions, a combination of middle of the line (MOL) contacts and back end of the line (BEOL) vias/wires, or any other suitable interconnect for electrically connecting a PFET and an NFET in series.

In each of the disclosed embodiments, at least one of the FETs (i.e., PFET 110 and/or NFET 120) is a VT-programmable FET having at least one gate that is programmable (i.e., that is configured for VT programmability).

For purposes of this disclosure, VT-programmable transistors are transistors with a gate structure specifically configured to enable VT programming. For example, depending upon biasing conditions during a programming operation, a VT-programmable transistor may exhibit a low VT or a high VT or, optionally, any number of different VTs between a low VT and high VT. Oftentimes, a VT-programmable transistor will be employed as memory cell. For example, a VT-programmable transistor having a low VT (also referred to herein as an unprogrammed state) can be read out as storing a first stored data value (e.g., a logic value of "0"); whereas a VT-programmable transistors having a high VT (also referred to herein as a programmed state) can be read out as storing a second stored data value (e.g., a logic value of "1"). The memory window (MW) of a VT-programmable transistor refers the difference between the high VT and the low VT. The MW can be tuned (e.g., based on device parameters, programming voltages, etc.); however, it must be sufficiently large to ensure a sufficient read margin and to minimize the read error rate.

Figure 3:
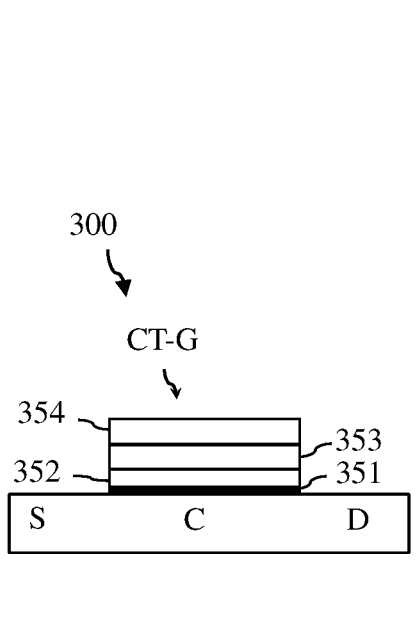
FIG. 3 is a cross-section diagram illustrating an example of a charge trap field effect transistor (CTFET), which could be incorporated into a device of FIGS. 1A-1G as a VT-programmable field effect transistor.
Figure 4:
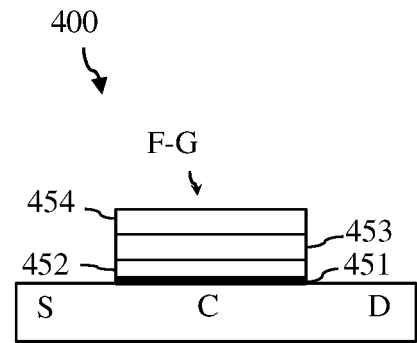
FIG. 4 is a cross-section diagram illustrating an example of a floating gate field effect transistor (FGFET), which could be incorporated into a device of FIGS. 1A-1G as a VT-programmable field effect transistor.
Figure 5A:
FIGS. 5A-5G are cross-section diagrams of the devices of FIGS. 1A-1G, respectively, implemented in a semiconductor-on-insulator processing technology platform.
Figure 5A:
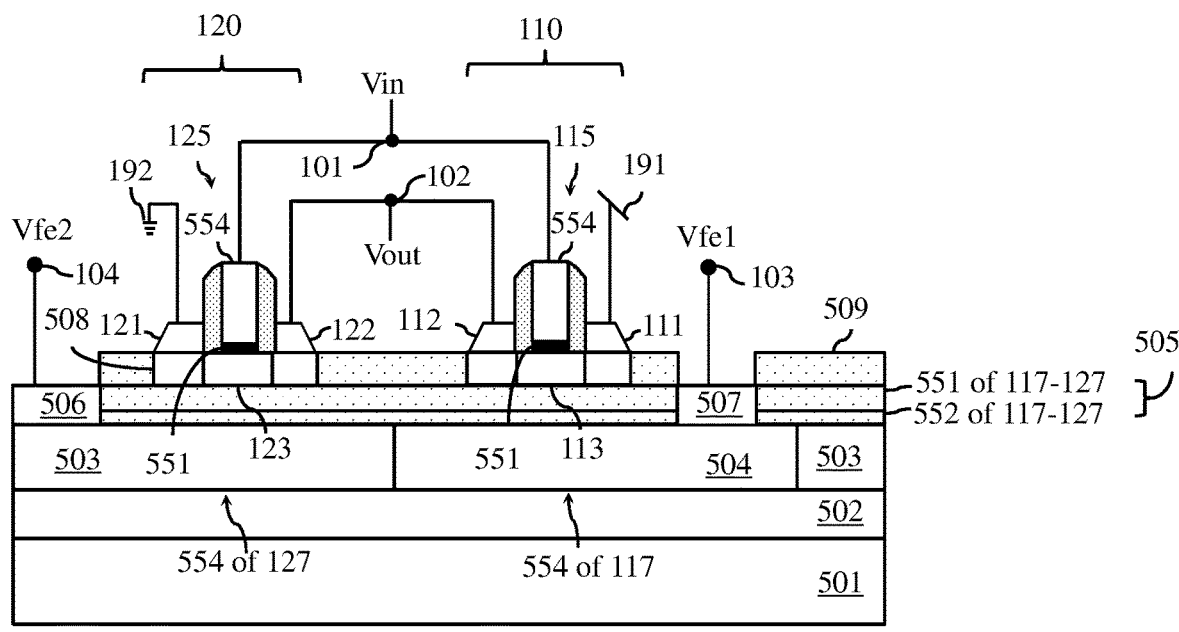
Figure 5B:
Figure 5B:
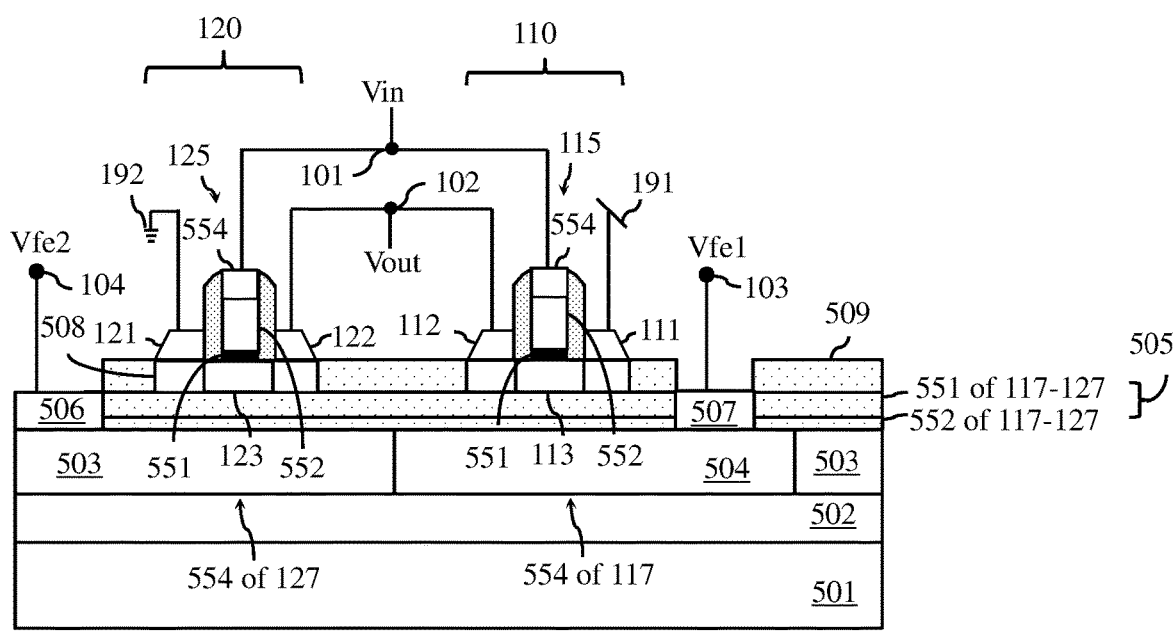
Figure 5C:
Figure 5C:
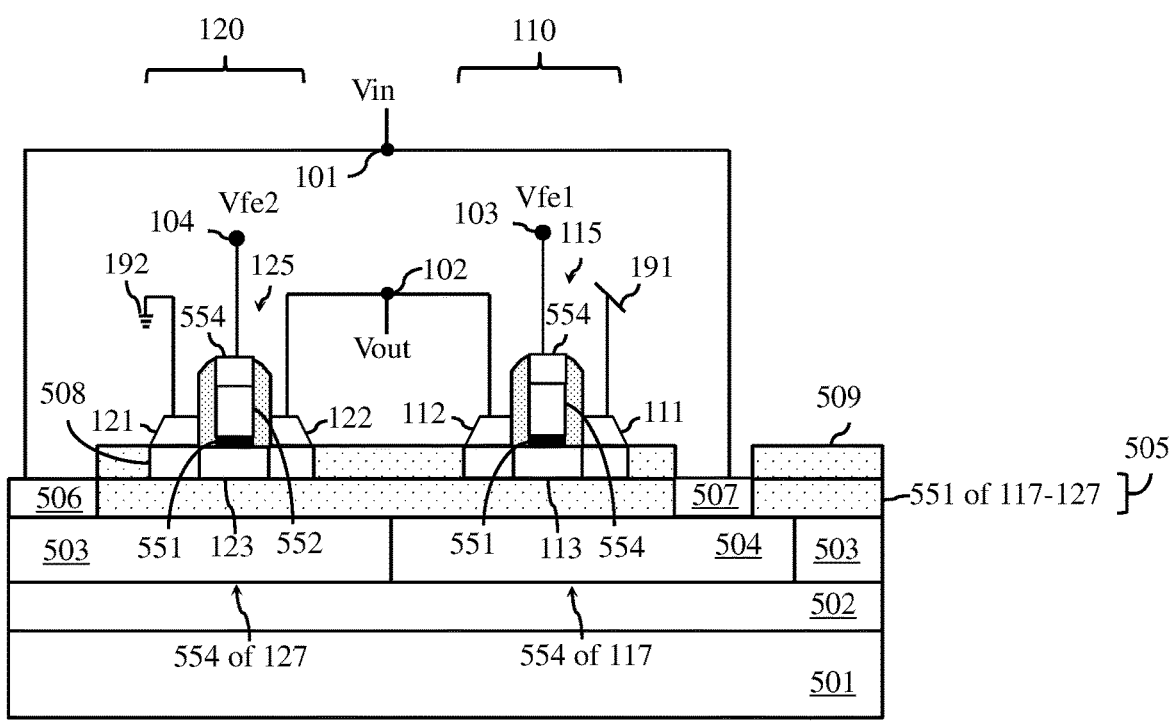
Figure 5D:
Figure 5D:
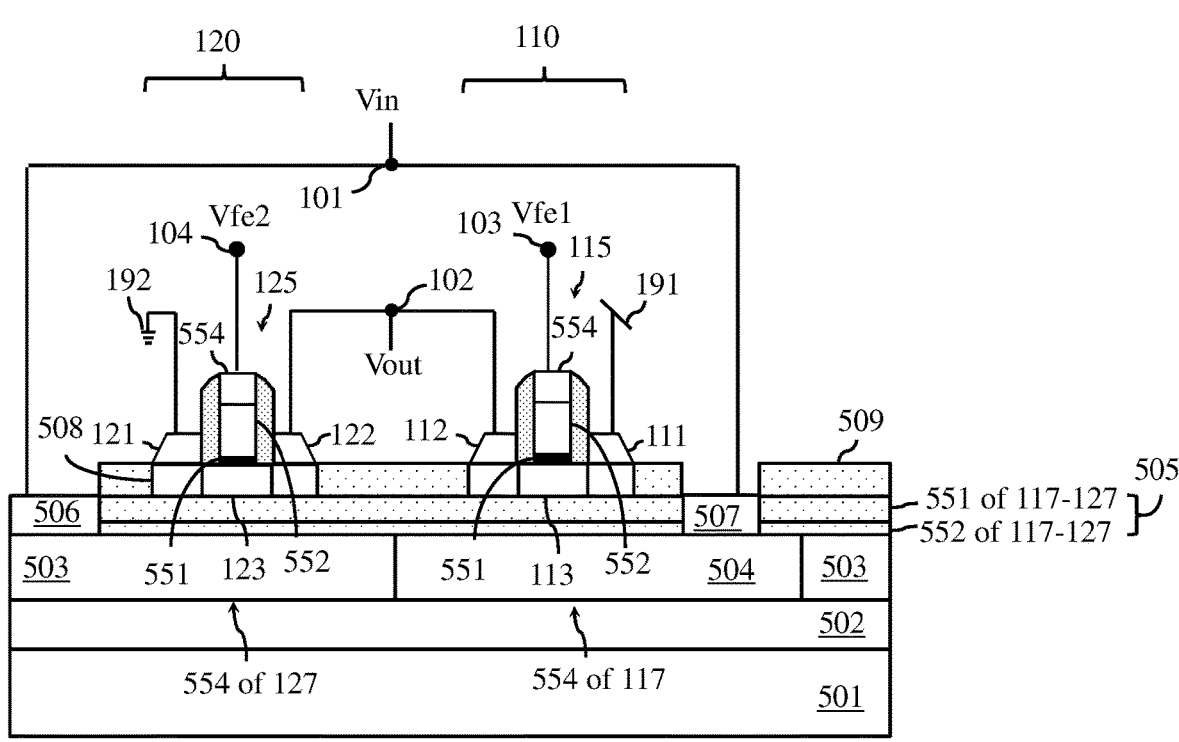
Figure 5E:
Figure 5E:
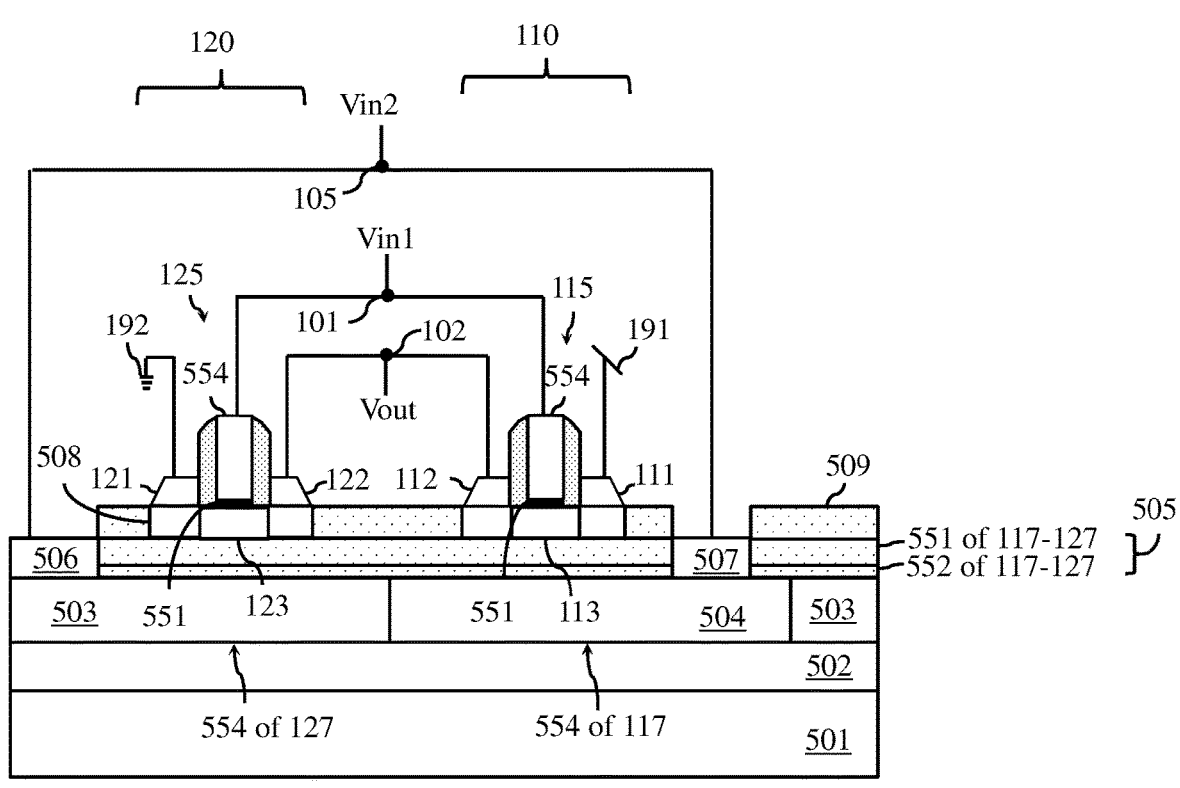
Figure 5F:
Figure 5F:
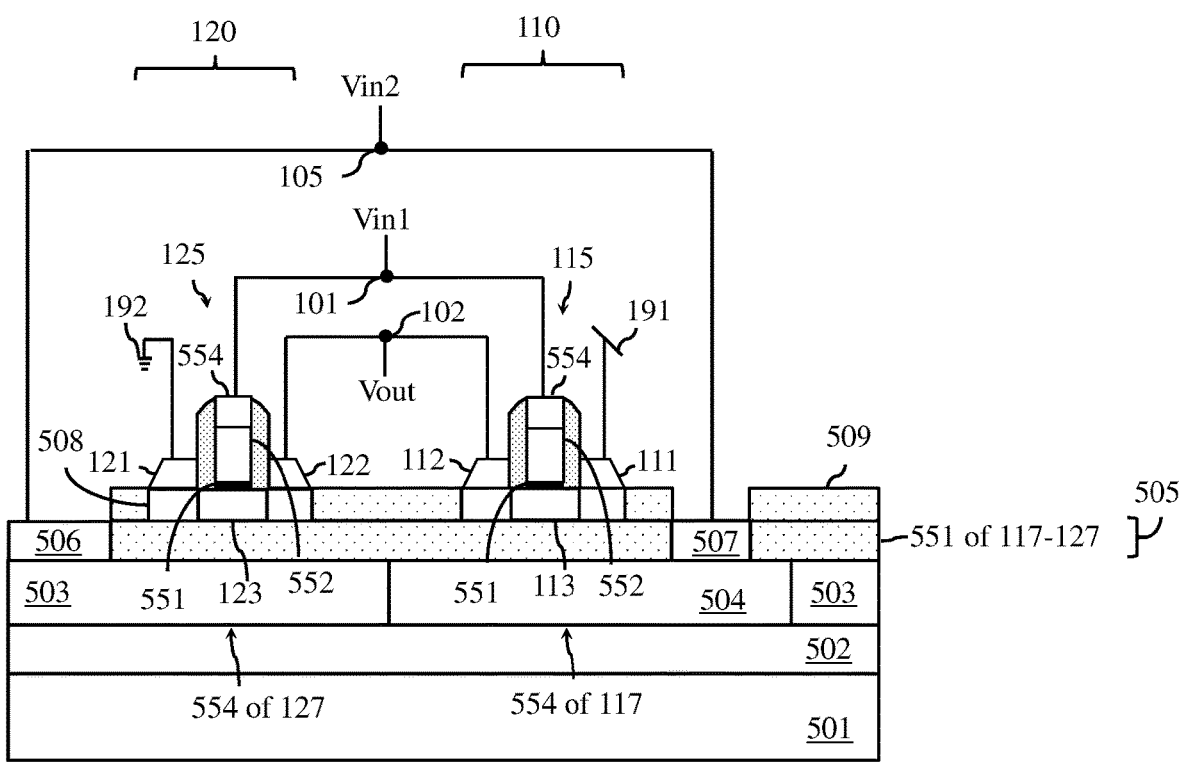
Figure 5G:
Figure 5G:
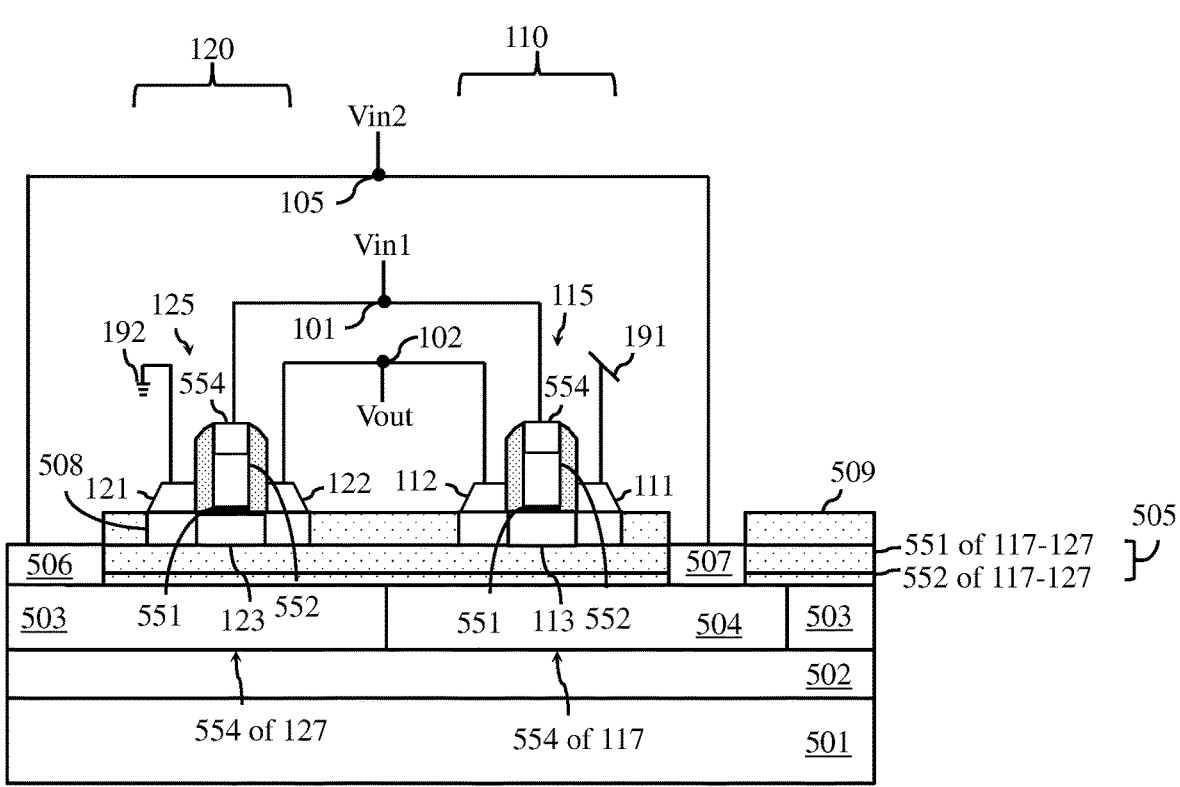

Examples of VT-programmable transistors include, but are not limited to, ferroelectric field effect transistors (FeFETs) (e.g., see FIG. 2), charge trap field effect transistors (CTFETs) (see FIG. 3), and floating gate field effect transistors (FGFETs) (e.g., see FIG. 4).

Figure 2:
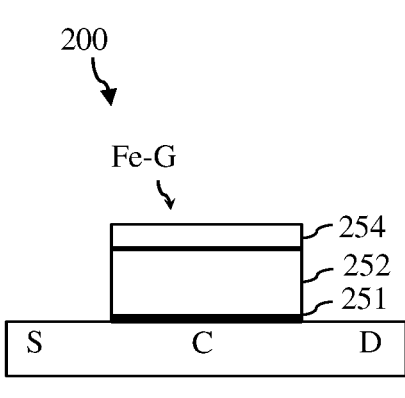
FIG. 2 is a cross-section diagram illustrating an example of a ferroelectric field effect transistor (FeFET), which could be incorporated into a device of FIGS. 1A-1G as a VT-programmable field effect transistor.

Specifically, FIG. 2 is a cross-section diagram illustrating a FeFET 200 including a programmable gate and, particularly, a FeFET gate (Fe-G). A FeFET can include a channel region (C) between source/drain (S/D) regions. The FeFET could be a P-channel FeFET. In this case, the S/Ds can have P-type conductivity at a relatively high conductivity level (e.g., they can be P+ source/drain regions). The channel region can have N-type conductivity at a relatively low conductivity level (e.g., it can be an N– channel region). Alternatively, the channel region can be undoped. A FeFET could also be an N-channel FeFET. In this case, S/Ds can have N-type conductivity at a relatively high conductivity level (e.g., they can be N+ source/drain regions). The channel region can have P-type conductivity at a relatively low conductivity level (e.g., it can be a P-channel region). Alternatively, the channel region can be undoped.

A FeFET 200 can further include a FeFET gate (Fe-G) adjacent to the channel region. Fe-G can be a multi-layered structure including, for example, a gate dielectric layer 251 on the channel region, a ferroelectric layer 252 (e.g., a hafnium oxide layer or some other suitable ferroelectric layer) on gate dielectric layer 251, and a gate conductor layer 254 on ferroelectric layer 252. Fe-G can be selectively programmed so that the FeFET has a low VT, a high VT, or one or more VTs in between the low VT and the high VT.

For example, to selectively program Fe-G of a P-channel FeFET so that it has a high Vt, a positive voltage pulse (e.g., VDD) could be applied to Fe-G and 0.0V could be applied to the S/D(s). This results in the direction of polarization vector of ferroelectric layer 252 pointing toward the channel region (i.e., it results in + poles of di-poles in ferroelectric layer 252 being adjacent to gate dielectric layer 251 and – poles of the di-poles being adjacent to gate conductor layer 254) such that electrons are attracted to the channel region, thereby blocking a conductive region from developing in the channel region between the S/Ds. To selectively program a Fe-G of a P-channel FeFET so that it has a low VT, either: (a) a negative voltage pulse can be applied to Fe-G and 0.0V can be applied to S/D(s); or (b) 0.0V can be applied to Fe-G and a positive voltage pulse can be applied to S/D(s). This results in the direction of polarization vector of ferroelectric layer 252 pointing toward gate conductor layer 254 (i.e., it results in + poles of di-poles in ferroelectric layer 252 being adjacent to gate conductor layer 254 and – poles of the di-poles being adjacent gate dielectric layer 251) such that electrons are repelled from the channel region and holes are attracted thereto, thereby forming a conductive region between the S/Ds.

To selectively program Fe-G of an N-channel FeFET so that it has a low Vt, a positive voltage pulse (e.g., VDD) could be applied to Fe-G and 0.0V could be applied to the S/D(s). This results in the direction of polarization vector of ferroelectric layer 252 pointing toward the channel region (i.e., it results in + poles of di-poles in ferroelectric layer 252 being adjacent gate dielectric layer 251 and – poles of the di-poles being adjacent to gate conductor layer 254) such that electrons are attracted to the channel region, thereby creating a conductive region within the channel region between the S/Ds. To selectively program Fe-G of an N-channel FeFET so that it has a high VT, either: (a) a negative voltage pulse can be applied to Fe-G and 0.0V can be applied to S/D(s); or (b) 0.0V can be applied to Fe-G and a positive voltage pulse can be applied to S/D(s). This results in the direction of polarization vector of ferroelectric layer 552 pointing toward gate conductor layer 254 (i.e., it results in + poles of di-poles in ferroelectric layer 552 being adjacent to gate conductor layer 254 and – poles of the di-poles being adjacent to gate dielectric layer 251) such that electrons are repelled from the channel region, thereby eliminating any conductive region between the S/Ds.

FIG. 3 is a cross-section diagram illustrating an example of a CTFET 300 including a programmable gate and, particularly, a CTFET gate (CT-G). A CTFET 300 can include a channel region (C) between source/drain (S/D) regions. The CTFET could be a P-channel CTFET. In this case, the S/Ds can have P-type conductivity at a relatively high conductivity level (e.g., they can be P+ source/drain regions). The channel region can have N-type conductivity at a relatively low conductivity level (e.g., it can be an N– channel region). Alternatively, the channel region can be undoped. A CTFET can further include a CTFET gate (CT-G) adjacent to the channel region. CT-G can be a multi-layered structure including, for example, a gate dielectric layer 351 on the channel region, a charge trap layer 352 (e.g., a silicon nitride layer) on gate dielectric layer 351, another gate dielectric layer 353 on charge trap layer 352 and a gate conductor layer 354 on the gate dielectric layer 353. To selectively program CT-G of a CTFET, specific voltages are applied to CT-G and S/D(s) to cause electrons either to move into or out of charge trap layer 352, thereby adjusting VT.

FIG. 4 is a cross-section diagram illustrating an example of a FGFET 400 including a programmable gate and, particularly, a FGFET gate (F-G). A FGFET 400 can include a channel region (C) between source/drain (S/D) regions. The FGFET could be a P-channel CTFET. In this case, the S/Ds can have P-type conductivity at a relatively high conductivity level (e.g., they can be P+ source/drain regions). The channel region can have N-type conductivity at a relatively low conductivity level (e.g., it can be an N– channel region). Alternatively, the channel region can be undoped. A FGFET can further include a FGFET gate (F-G) adjacent to the channel region. F-G can be a multi-layered structure including, for example, a gate dielectric layer 451 on the channel region, a floating gate layer 452 (e.g., a polysilicon layer) on gate dielectric layer 451, another gate dielectric layer 453 on floating gate layer 452 and a gate conductor layer 454 on the gate dielectric layer 453. To selectively program F-G of a FGFET, specific voltages are applied to F-G and S/D(s) to cause electrons either to move into or out of floating gate layer 452, thereby adjusting VT.

Those skilled in the art will recognize that FETs can be single-gated. That is, they can include a single gate structure adjacent to a surface of a semiconductor body at a channel region. Alternatively, FETs can be multi-gated. That is, they can have multiple gates adjacent to different surfaces of the channel. In some multi-gate FETs, the different gates can be isolated from each other and independently biasable. For example, some dual-gate FETs can have two independently biasable gates; some tri-gate FETs can have three independently biasable gates, and so on. Furthermore, in at least some of these FETs with independently biasable gates one or more of the gates could potentially be programmable (i.e., configured for VT programmability), as described above and illustrated in FIGS. 2-4.

Devices 100A-100G shown in FIGS. 1A-1G each have FETs with two independently biasable gates. Specifically, PFET 110 (i.e., the first transistor) has a first primary gate 115 and a first secondary gate 117 adjacent to opposing surfaces of first channel region 113 and electrically isolated from each other. Similarly, NFET 120 (i.e., the second transistor) has a second primary gate 125 and a second secondary gate 127 adjacent to opposing surfaces of second channel region 123 and electrically isolated from each other. Such dual-gated FETs with independently biasable gates are available in various different processing technology platforms, such as fully-depleted semiconductor-on-insulator processing technology platforms (e.g., fully depleted silicon-on-insulator (FDSOI) processing technology platforms), in non-planar device processing technology platforms (e.g., fin-type field effect transistor (FinFET) processing technology platforms), etc. It should be understood that any of these processing technologies could be employed to implement devices 100A-100G of FIGS. 1A-1G.

For purposes of illustration, FIGS. 5A-5G illustrate examples of devices 100A-100G, respectively, implemented in an advanced semiconductor-on-insulator processing technology platform (e.g., an FDSOI processing technology platform). In this case, a semiconductor-on insulator structure can include a semiconductor substrate 501. Semiconductor substrate 501 can be, for example, a monocrystalline silicon substrate or, alternatively, a monocrystalline substrate of any other suitable semiconductor material (e.g., silicon germanium, etc.). The semiconductor-on-insulator structure can further include an insulator layer 505 on semiconductor substrate 501. Insulator layer 505 include, for example, at least one layer of insulator material (e.g., silicon dioxide or any other suitable insulator material). Optionally, insulator layer 505 could include multiple different layers of insulator material. In some cases, as discussed in greater detail below, the different layers of insulator material could be employed to achieve back gate VT programmability. The semiconductor-on-insulator structure can further include a semiconductor layer 508 on insulator layer 505. The semiconductor layer 508 can be, for example, a monocrystalline silicon layer or a layer of any other suitable monocrystalline semiconductor material (e.g., silicon germanium, etc.).

PFET 110 and NFET 120 can have corresponding active device regions in semiconductor layer 508. These active device regions can be laterally surrounded by isolation regions 509 (e.g., shallow trench isolation (STI) regions) that extend through semiconductor layer 508 to insulator layer 505. PFET 110 can include, within its active device region, first channel region 113 positioned laterally between first source region 111 and first drain region 112. NFET 120 can include, within its active device region, second channel region 123 positioned laterally between second source region 121 and second drain region 122. Optionally, the source/drain regions can include raised portions (e.g., doped epitaxial semiconductor layers) on the top surface of semiconductor layer 508. PFET 110 and NFET 120 can further include a first primary gate 115 and a second primary gate 125 on the top surface of semiconductor layer 508 over first channel region 113 and second channel region 123, respectively. First primary gate 115 and second primary gate 125 can be electrically isolated from adjacent source/drain regions by gate sidewall spacers.

Those skilled in the art will recognize that one advantage of fully depleted semiconductor-on-insulator technology processing platforms (e.g., FDSOI processing technology platforms) is that FETs can be formed on an insulator layer above a well region (e.g., an Nwell or a Pwell) within the semiconductor substrate in order to achieve different types of NFETs or PFETs with different threshold voltages (VTs). For purposes of this disclosure, a well region refers to a doped region of a semiconductor material. A Pwell is a P-type doped region, whereas an Nwell is an N-type doped region. For super low threshold voltage (SLVT) or low threshold voltage (LVT) devices, a PFET can be on an insulator layer aligned above a Pwell and an NFET can be on an insulator layer aligned above an Nwell. For regular threshold voltage (RVT) or high threshold voltage (HVT) devices, a PFET can be on an insulator layer aligned above an Nwell and an NFET can be on an insulator layer aligned above a Pwell. Whether the devices SLVT or LVT (or RVT or HVT) devices will depend upon the design (e.g., device size, etc.) and process specifications (e.g., dopant concentrations, etc.). Another advantage of fully depleted semiconductor-on-insulator (e.g., FDSOI) processing technology platforms is back biasing. Specifically, in such structures, portions of the insulator layer and the well region aligned below the channel region can effectively function as gate dielectric and gate conductor layers of a secondary gate (also referred to as a back gate). The secondary gate can be biased by biasing the well region and can thereby be used to fine tune VT. Forward back biasing (FBB) refers to back biasing that reduces VT; whereas reverse back biasing (RBB) refers to biasing that increases VT.

In devices 100A-100G of FIGS. 5A-5G, PFET 110 can be on insulator layer 505 over a Pwell 504 within semiconductor substrate 501 and NFET 120 can be on insulator layer 505 over an Nwell 503 within semiconductor substrate 501. Thus, in this example, PFET 110 and NFET 120 would be either LVT or SLVT FETs. Alternatively, the position of the well regions could be swapped so that PFET 110 and NFET 120 were either RVT or HVT FETs. In any case, a buried Nwell 502 can be within semiconductor substrate 501 below Pwell 504 to isolating Pwell 203 from a lower portion of semiconductor substrate 501. Thus, in devices 100A-100G of FIGS. 5A-5G, portions of insulator layer 505 and Pwell 504 below first channel region 113 of PFET 110 effectively function as gate dielectric and conductor layers of a first secondary gate 117 and portions of insulator layer 505 and Nwell 503 below second channel region 123 effectively function as gate dielectric and gate conductor layers of a second secondary gate 127 of NFET 120.

Well taps can allow discrete electrical connections to be made to Pwell 504 and Nwell 503 and, thereby allow first secondary gate 117 and second secondary gate 127, respectively, to be biased. Specifically, a pair of well tap openings can extend vertically through isolation region 509 and insulator layer 505 to Pwell 504 and to Nwell 503, respectively. A Pwell tap 507 can be immediately adjacent to Pwell 504 in one well tap opening and can have P+ conductivity. Pwell tap 507 can be an in situ-doped epitaxial semiconductor layer immediately adjacent to the top surface of semiconductor substrate 501 at Pwell 504. Alternatively, Pwell tap 507 could be a shallow P+ doped region within Pwell 504. Similarly, an Nwell tap 506 can be immediately adjacent to Nwell 503 in another well tap opening and can have N+ conductivity. Nwell tap 506 can be an in situ-doped epitaxial semiconductor layer immediately adjacent to the top surface of semiconductor substrate 501 at Nwell 503. Alternatively, Nwell tap 506 could be a shallow N+ doped region within Nwell 503.

As illustrated in FIGS. 1A-1G and also illustrated in FIGS. 5A-5G, the primary gates of the PFET and NFET and/or the secondary gates of the PFET and NFET in devices 100A-100G can be programmable (i.e., configured for VT programmability). Devices 100A-100G vary with regard to whether the primary gates the secondary gates, or both the primary gates and the secondary gates of PFET 110 and NFET 120 are programmable (i.e., configured for VT programmability).

For purposes of illustration, PFET 110 and NFET 120 in devices 100A-100G of FIGS. 5A-5G are shown as being FeFETs, each having at least one ferroelectric gate (Fe-G). Each ferroelectric gate includes a gate dielectric layer 551 (e.g., silicon dioxide or any other suitable gate dielectric material), a gate conductor layer 554 (e.g., a doped semiconductor and/or a metal gate conductor material), and a ferroelectric layer 552 (e.g., a hafnium oxide layer or a layer of some other suitable ferroelectric material) between and immediately adjacent to gate dielectric layer 551 and gate conductor layer 554 (see the detailed discussion of ferroelectric gates with regard to FIG. 2 above). It should, however, be understood that, alternatively, PFET 110 and NFET 120 could be CTFETs (each with at least one charge trap gate), FGFETs (each with at least one floating gate), or any other suitable type of VT programmable FETs with a programmable gate. In any case, when a PFET 110 and NFET 120 has a non-programmable gate, the non-programmable gate is shown in FIGS. 5A, 5C, 5E and 5F as including only a gate dielectric layer 551 (e.g., silicon dioxide or any other suitable gate dielectric material) and a gate conductor layer 554 (e.g., a doped semiconductor and/or a metal gate conductor material). It should, however, be understood that, alternatively, such non-programmable gates could have any suitable non-programmable gate configuration.

In the disclosed embodiments, devices 100A-100G further vary with regard to number and placement of input node(s) and whether or not independent bias voltages are applied to any of the primary or secondary gates.

Referring to FIGS. 1A-1B and 5A-5B, in device 100A, first primary gate 115 of PFET 110 and second primary gate 125 of NFET 120 are not programmable, whereas first secondary gate 117 of PFET 110 and second secondary gate 127 of NFET 120 are programmable. In this case, first primary gate 115 and second primary gate 125 can be any suitable type of conventional gate structures (e.g., gate first polysilicon gate structures, gate first high-K metal gate (HKMG) structures, replacement metal gate (RMG) structures, etc.) that include a gate dielectric layer 551 and a gate conductor layer 554 immediately adjacent to gate dielectric layer 551. First secondary gate 117 of PFET 110 and second secondary gate 127 of NFET 120 can be, for example, ferroelectric gates. In device 100B, first primary gate 115, second primary gate 125, first secondary gate 117, and second secondary gate 127 are all programmable (i.e., configured for VT programmability). In this case, first primary gate 115, second primary gate 125, first secondary gate 117, second secondary gate 127 can all be, for example, ferroelectric gates. Ferroelectric back gate formation can be achieved in first secondary gate 117 and second secondary gate 127 using an insulator layer 505 that is multi-layered. For example, insulator layer 505 can include one layer (which is, for example, a layer of silicon dioxide layer or other suitable gate dielectric material and functions as a gate dielectric layer 551) below and immediately adjacent to semiconductor layer 508. Insulator layer 505 can further include a second layer (which is, for example, hafnium oxide or some other suitable ferroelectric material for a ferroelectric layer 552) below and immediately adjacent to the first layer.

Additionally, in devices 100A and 100B, voltage input node 101 can be electrically connected to receive an input voltage (Vin) and can further be electrically connected to first primary gate 115 of PFET 110 and to second primary gate 125 of NFET 120 so that Vin is applied to those gates. Also, in devices 100A and 100B, a pair of additional input nodes 103-104 can be electrically connected to first secondary gate 117 and to second secondary gate 127, respectively, (e.g., via well taps 507 and 506) and can further be electrically connected to receive independent bias voltages (Vfe1 and Vfe2) so that Vfe1 is applied to first secondary gate 117 and Vfe2 is applied to second secondary gate 127.

Referring to FIGS. 1C-1D and 5C-5D, in device 100C, first secondary gate 117 of PFET 110 and second secondary gate 127 of NFET 120 are not programmable, whereas first primary gate 115 of PFET 110 and second primary gate 125 of NFET 120 are programmable. In this case, first primary gate 115 and second primary gate 125 can be, for example, ferroelectric front gates. First secondary gate 117 and second secondary gate 127 can be conventional back gates. In device 100D, first primary gate 115, second primary gate 125, first secondary gate 117, and second secondary gate 127 can all be programmable. In this case, first primary gate 115, second primary gate 125, first secondary gate 117, and second secondary gate 127 can all be, for example, ferroelectric back gate formation can be achieved in first secondary gate 117 and second secondary gate 127 using an insulator layer 505 that is multi-layered. For example, insulator layer 505 can include one layer (which is, for example, a layer of silicon dioxide layer or other suitable gate dielectric material and functions as a gate dielectric layer 551) below and immediately adjacent to semiconductor layer 508. Insulator layer 505 can further include a second layer (which is, for example, hafnium oxide or some other suitable ferroelectric material for a ferroelectric layer 552) below and immediately adjacent to the first layer.

Additionally, in devices 100C and 100D, voltage input node 101 can be electrically connected to receive an input voltage (Vin) and can further be electrically connected to first secondary gate 117 of PFET 110 and to second secondary gate 127 of NFET 120 so that Vin is applied to those gates. Also, in devices 100C and 100D, a pair of additional input nodes 103-104 can be electrically connected to first primary gate 115 and to second primary gate 125, respectively, and can further be electrically connected to receive independent bias voltages (Vfe1 and Vfe2) so that Vfe1 is applied to first primary gate 115 and Vfe2 is applied to second primary gate 125.

Devices 100A-100D can each further include a voltage output node 102 at the interconnect between PFET 110 and NFET 120 and, particularly, at the interconnect that electrically connects first drain region 112 of PFET 110 to second drain region 122 of NFET 120. Devices 100A-100D have inverter functionality and a tunable trigger voltage. By independently adjusting Vfe1 and Vfe2, location, skew, rise/fall time of inverter trigger voltage are controllable without a static power supply. Vfe1 and Vfe2 can also be employed to switch the ferroelectric gate that receives it in order to avoid destructive disturbances during a read-out. Each device 100A-100D can be incorporated into a logic device (e.g., an inverter or NOT gate), a memory cell, etc. By including such a device in a memory cell, the memory window can be largely enhanced.

Referring to FIGS. 1E-1G and 5E-5G, in device 100E, first primary gate 115 of PFET 110 and second primary gate 125 of NFET 120 are not programmable, whereas first secondary gate 117 of PFET 110 and second secondary gate 127 of NFET 120 are programmable. In this case, first primary gate 115 and second primary gate 125 can be any suitable type of conventional gate structures (e.g., gate first polysilicon gate structures, gate first high-K metal gate (HKMG) structures, replacement metal gate (RMG) structures, etc.) that includes a gate dielectric layer 551 and a gate conductor layer 554 immediately adjacent to gate dielectric layer 551. First secondary gate 117 of PFET 110 and second secondary gate 127 of NFET 120 can be, for example, ferroelectric gates. In device 100F, first primary gate 115 of PFET 110 and second primary gate 125 of NFET 120 are programmable, whereas first secondary gate 117 of PFET 110 and second secondary gate 127 of NFET 120 are not programmable. In this case, first primary gate 115 of PFET 110 and second primary gate 125 of NFET 120 can be, for example, ferroelectric front gates. First secondary gate 117 and second secondary gate 127 can be conventional back gates. In device 100G, first primary gate 115, second primary gate 125, first secondary gate 117, and second secondary gate 127 are programmable. In this case, first primary gate 115, second primary gate 125, first secondary gate 117, second secondary gate 127 can all be, for example, ferroelectric gates. As in devices 100A, 100B, and 100D discussed above, in devices 100E and 100G, ferroelectric back gate formation can be achieved in first secondary gate 117 and second secondary gate 127 using an insulator layer 505 that is multi-layered. For example, insulator layer 505 can include one layer (which is, for example, a layer of silicon dioxide layer or other suitable gate dielectric material and functions as a gate dielectric layer 551) below and immediately adjacent to semiconductor layer 508. Insulator layer 505 can further include a second layer (which is, for example, hafnium oxide or some other suitable ferroelectric material for a ferroelectric layer 552) below and immediately adjacent to the first layer.

Additionally, in devices 100E, 100F, and 100G, a first voltage input node 101 can be electrically connected to receive a first input voltage (Vin1) and can further be electrically connected to first primary gate 115 of PFET 110 and to second primary gate 125 of NFET 120 so that Vin1 is applied to those gates. Also, in devices 100E, 100F, and 100G, a second voltage input node 105 can be electrically connected to receive a second input voltage (Vin2) and can further be electrically connected to first secondary gate 117 of PFET 110 and to second secondary gate 127 of NFET 120 so that Vin2 is applied to those gates.

Devices 100E-100F can each further include a voltage output node 102 at the interconnect between PFET 110 and NFET 120 and, particularly, at the interconnect that electrically connects first drain region 112 of PFET 110 to second drain region 122 of NFET 120. Devices 100E-100G have inverter-like functionality (based on a combination of Vin1 and Vin2) and a tunable trigger voltage. Input voltage(s) connected to ferroelectric gates can be used to control location, skew, rise/fall time of inverter trigger voltage without a static power supply and can further be employed to avoid destructive disturbance during a read-out. Each device 100E-100G can be incorporated into a logic device (e.g., an inverter or NOT gate), a memory cell, etc. By including such a device in a memory cell, the memory window can be largely enhanced. Furthermore, by selectively adjusting one input voltage connected to one set of ferroelectric gates, different Vout levels can be achieved in response to the other input voltage applied to the other set of gates (which as mentioned above can be either ferroelectric gates or not).

It should be understood that FIGS. 5A-5G are not intended to be limiting and that, alternatively, the disclosed devices can be implemented using any other type of technology processing platform in which FETs can be formed that include: two or more independently biasable gates where at least one of the gates can be programmable (i.e., configured for VT programmability). Techniques for forming such FETs in different processing technology platforms, such as in fully depleted semiconductor-on-insulator processing technology platforms (e.g., FDSOI processing technology platforms), as illustrated, or in fin-type field effect transistor (FinFET) processing technology platforms are known in the art. Thus, the details of such techniques have been omitted from this specification in order to allow the reader to focus on the salient aspects of the disclosed embodiments related to the connections of the primary and/or secondary gates of PFET 110 and NFET 120 to input node(s), to additional nodes for receiving bias voltages, etc. for tuning trigger voltage.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
a first transistor comprising a P-channel field effect transistor;
a second transistor comprising an N-channel field effect transistor, wherein the first transistor and the second transistor are connected in series by an interconnect and have multiple gates and wherein at least one of the first transistor and the second transistor is a threshold voltage programmable transistor; and
an output node at the interconnect.

2. The device of claim 1,
wherein the interconnect connects a first drain region of the first transistor to a second drain region of the second transistor,
wherein the first transistor has a first source region connected to a positive voltage rail, and
wherein the second transistor has a second source region connected a ground rail.

3. The device of claim 1,
wherein the first transistor includes at least a first primary gate and a first secondary gate, and
wherein the second transistor includes at least a second primary gate and a second secondary gate.

4. The device of claim 3,
wherein the first transistor and the second transistor are threshold voltage programmable transistors, and
wherein the device further comprises:
a voltage input node connected to the first primary gate and to the second primary gate and further connected to receive an input voltage; and
additional input nodes connected to the first secondary gate and to the second secondary gate, respectively, and further connected to receive independent bias voltages.

5. The device of claim 4, wherein the first secondary gate of the first transistor and the second secondary gate of the second transistor are programmable.

6. The device of claim 4, wherein the first primary gate and the first secondary gate of the first transistor and the second primary gate and the second secondary gate of the second transistor are programmable.

7. The device of claim 4, wherein the first transistor and the second transistor are ferroelectric field effect transistors.

8. The device of claim 4, wherein the first transistor and the second transistor are semiconductor-on-insulator structures.

9. A device comprising:
a first transistor including a first primary gate and a first secondary gate, wherein the first transistor is a threshold voltage-programmable P-channel field effect transistor;
a second transistor including a second primary gate and a second secondary gate, wherein the first transistor and the second transistor are connected in series by an interconnect, and wherein the second transistor is a threshold voltage-programmable N-channel field effect transistor; and
an output node at the interconnect.

10. The device of claim 9,
wherein the interconnect connects a first drain region of the first transistor and a second drain region of the second transistor,
wherein the first transistor has a first source region connected to a positive voltage rail, and
wherein the second transistor has a second source region connected a ground rail.

11. The device of claim 9, further comprising:
a voltage input node connected to the first secondary gate and to the second secondary gate and further connected to receive an input voltage; and
additional input nodes connected to the first primary gate and to the second primary gate, respectively, and further connected to receive independent bias voltages.

12. The device of claim 9, wherein the first primary gate of the first transistor and the second primary gate of the second transistor are programmable.

13. The device of claim 9, wherein the first primary gate and the first secondary gate of the first transistor and the second primary gate and the second secondary gate of the second transistor are programmable.

14. The device of claim 9, where the first transistor and the second transistor are ferroelectric field effect transistors.

15. The device of claim 9, wherein the first transistor and the second transistor are semiconductor-on-insulator structures.

16. A device comprising:
a first transistor including a first primary gate and a first secondary gate, wherein the first transistor is a threshold voltage-programmable P-channel field effect transistor;
a second transistor including a second primary gate and a second secondary gate, wherein the second transistor is a threshold voltage-programmable N-channel field effect transistor;
a first voltage input node connected to the first primary gate and to the second primary gate and further connected to receive a first input voltage;
a second voltage input node connected to the first secondary gate and to the second secondary gate and further connected to receive a second input voltage;

an interconnect connecting a first drain region of the first transistor to a second drain region of the second transistor; and an output node at the interconnect.

17. The device of claim 16, wherein the first transistor has a first source region connected to a positive voltage rail and wherein the second transistor has a second source region connected a ground rail.

18. The device of claim 16, wherein at least the first primary gate of the first transistor and the second primary gate of the second transistor are programmable.

19. The device of claim 16, wherein at least the first secondary gate of the first transistor and the second secondary gate of the second transistor are programmable.

20. The device of claim 16, wherein the first primary gate and the first secondary gate of the first transistor and the second primary gate and the second secondary gate of the second transistor are programmable.

* * * * *